United States Patent [19]

Sakamoto

[11] 4,415,989
[45] Nov. 15, 1983

[54] DUAL CONDUCTOR CURRENT ACCESS MAGNETIC BUBBLE MEMORY

[75] Inventor: Koji Sakamoto, Yatabemachi, Japan

[73] Assignees: Agency of Industrial Science and Technology; Ministry of International Trade and Industry, both of Tokyo, Japan

[21] Appl. No.: 249,465

[22] Filed: Mar. 31, 1981

[30] Foreign Application Priority Data

Jun. 2, 1980 [JP] Japan .................................. 55-74095

[51] Int. Cl.³ .............................................. G11C 19/08
[52] U.S. Cl. ..................................................... 365/19
[58] Field of Search .............................. 365/19, 20, 21

[56] References Cited
U.S. PATENT DOCUMENTS 4,187,555 2/1980 Bobeck ................................... 365/19

Primary Examiner—James W. Moffitt
Attorney, Agent, or Firm—Oblon, Fisher, Spivak, McClelland & Maier

[57] ABSTRACT

In a dual-conductor type current-access magnetic bubble memory, a major loop is provided with a zigzag propagation path through which the major loop is connected with a plurality of minor loops, and transfer gates between the major and respective minor loops are formed by juxtaposing in parallel and partially superposing a pair of apertures of the same pattern upon each other and are surrounded by a gate control conductor, whereby bubbles can successively be transferred between the major and minor loops with a current sequence for normal propagation in the major and minor loops when a gate current is applied to the gate control conductor.

8 Claims, 22 Drawing Figures

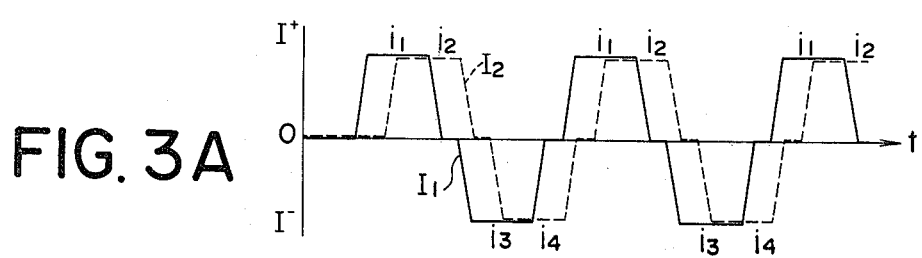
FIG. 3A
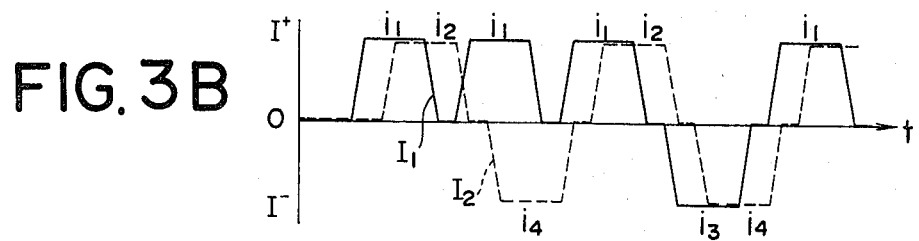
FIG. 3B
FIG. 4
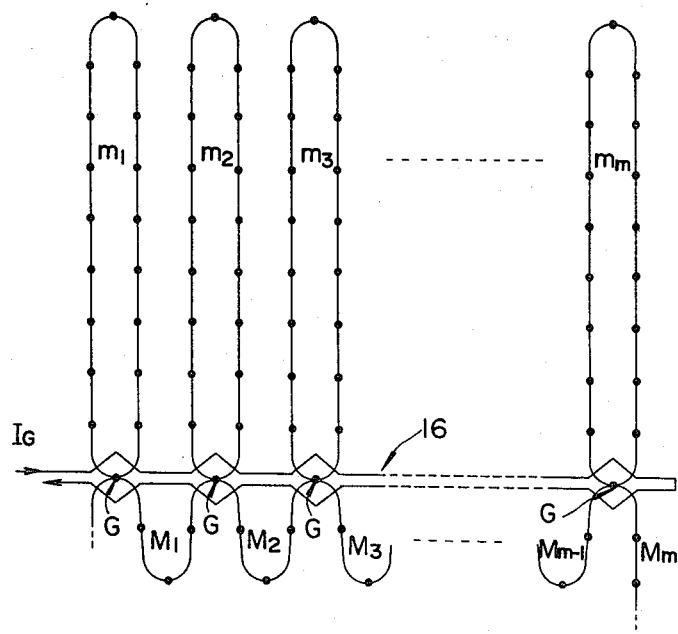

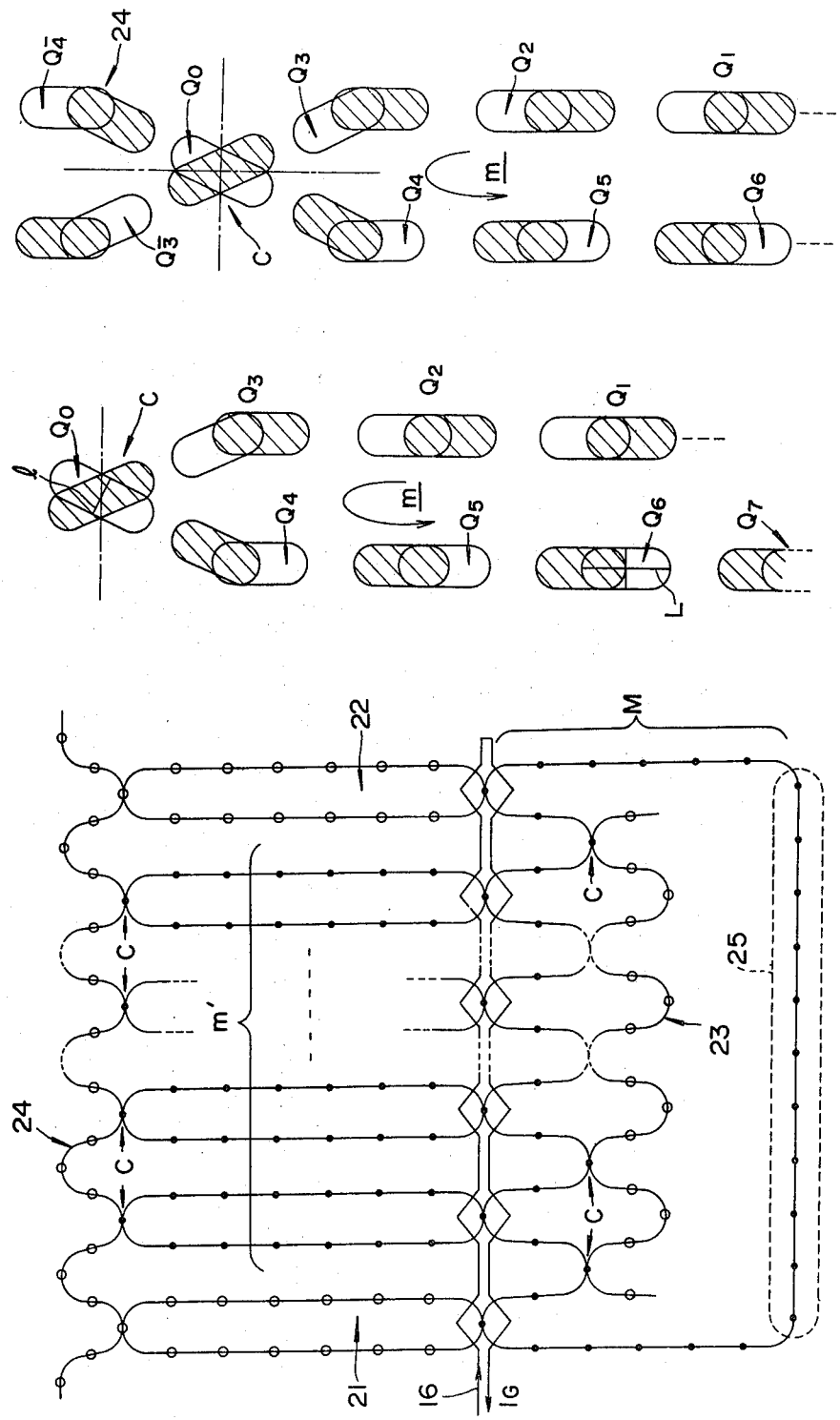

DUAL CONDUCTOR CURRENT ACCESS MAGNETIC BUBBLE MEMORY

BACKGROUND OF THE INVENTION

The present invention relates to a dual-conductor type current access magnetic bubble memory having transfer gates capable of efficiently transferring magnetic bubbles between the major loop and the minor loops.

The magnetic bubble memory has high storage capacity, is capable of high-speed operation and can store data non-volatilely. Because of these features it is arresting interest as a mass-storage memory. The magnetic bubble memory is essentially a serial access memory which basically comprises a major loop having a port for writing and reading information, a plurality of minor loops for storage of information and information transfer sites (transfer gates) for connection of the major loop to the minor loops.

In general, current-access bubble memories are more highly functional than field-access memories. Among the different kinds of current-access memories, the dual-conductor type memory is receiving the most attention because of the design flexibility it allows.

Magnetic bubble memory technology is fairly well established and is described, for example, in an article titled "Current-Access Magnetic Bubble Circuits" in The Bell System Technical Journal, Vol. 58 No. 6, July-August 1979, pp. 1453-1540, published by the American Telephone and Telegraph Company. Further improvements have been introduced to enhance storage capacity, while at the same time reducing bit cost and bubble driving current. However, there is still room for improvement in the conventional memory in connection with the structure of the transfer gates between the major-minor loops, which is one of particular importance for the magnetic bubble memory. The literature referred to above describes a transfer gate which is so constituted that a relatively small aperture formed in a first conductor is nested within a relatively large aperture formed in a second conductor at one corner of the minor loop to form a gate pattern for bubble transfer. When this arrangement is used, transfer of bubbles between the loops is carried out by modifying the pulse sequence for normal propagation in the loops. For this reason, it is impossible to apply sine-wave current suitable for bubble propagation, so that higher reliability cannot be realized.

To improve the versatility, it has been proposed to partially superpose apertures in the first and second conductors upon each other to form a transfer gate by which the minor loops are connected with the major loop consisting of a straight propagation path having one or two bit-positions each formed by a pair of apertures bored in the first and second conductors. (H. Chang, "Data Structures and VLSI Algorithms for Bubble Chips" IEEE Transactions on Magnetics, Vol. MAG-16, No. 5, September 1980, pp. 764-769). In the straight propagation path known to the art, however, three or more bubbles cannot be transferred continuously between the major loop and the respective minor loops and because of this, the number of information bits transferred cannot be increased beyond one. This and makes it impossible to perform on-chip parity error detection (on-chip parity check) for each minor loop.

SUMMARY OF THE INVENTION

One object of the present invention is to provide a magnetic bubble memory which functions to efficiently transfer a multiplicity of bits in close succession between the major loop and any given minor loop with regular sine current sequence for normal bubble propagation in the loops, and permits an on-chip parity check to be conducted for each minor loop.

To achieve the aforementioned object according to the present invention, there is provided a magnetic bubble memory which comprises a plurality of minor loops, a major loop having a zigzag propagation path having three or more bit positions each formed by a pair of apertures bored in the first and second conductors, a plurality of transfer gates defined by a pair of apertures arranged to connect the respective minor loops with the major loop along its zigzag propagation path and a gate control conductor for imparting magnetic potentials required for transfer operation.

The paired apertures forming the aforesaid transfer gate have an arrangement identical with that of the paired apertures constituting the propagation path of each loop. This assures that, depending upon whether or not gate current is applied upon the gate control conductor, it is determined either to take information out of the loops or to continue cyclic propagation on the loops while regular current sequence for normal bubble propagation is applied. Furthermore, the transfer gates constructed as mentioned above and provided on the respective minor loops are coupled together by way of the zigzag propagation path and the gate control conductor common to all the transfer gates is provided to impart magnetic potentials, whereby a multiplicity of information bits are transferred in a continuous manner between the major loop and the respective minor loops. In addition, the zigzag major loop arrangement makes it feasible to conduct a parity check by using as a parity bit one of a series of information bits transferred in and out of each minor loop.

Other objects and advantages of the present invention will become apparent from the following detailed description with reference to the accompanying drawings.

BRIEF EXPLANATION OF THE DRAWINGS

FIGS. 3A and 3B are diagrams illustrative of a current sequence for cyclic propagation of bubbles through loops and the bubble transfer between the loops.

FIG. 4 is a schematic view illustrative of the structure of one embodiment of the present invention.

FIG. 10 is a schematic view showing the structure of a memory chip with dummy propagation paths of the present invention.

FIGS. 11A and 11B are enlarged views of the corner portions of a simple loop and a loop with the dummy propagation paths.

DESCRIPTION OF THE PREFERRED EMBODIMENTS

Figure 1:
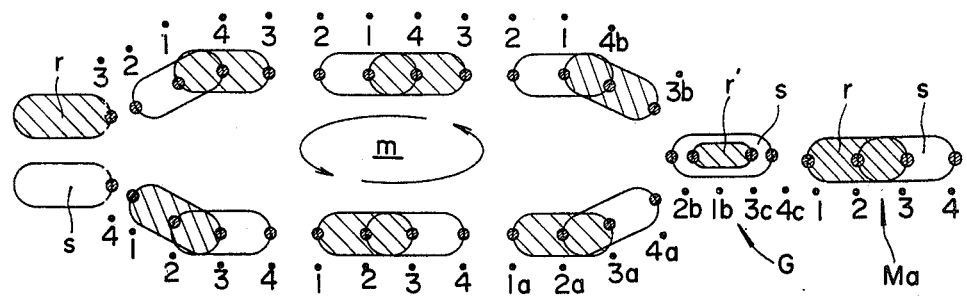
FIG. 1 is a schematic plan view illustrative of the bubble propagation mechanism in a minor loop and a transfer gate in the conventional memory.
Figure 2:
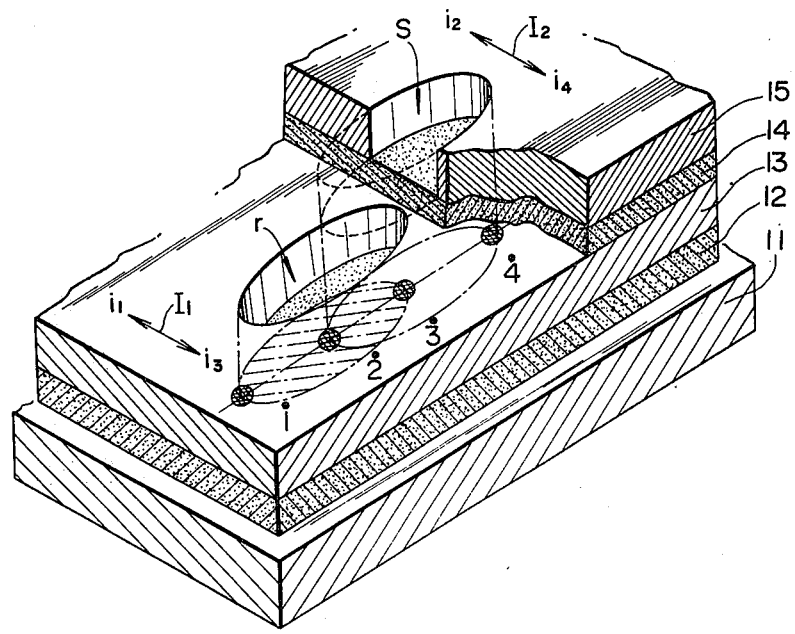
FIG. 2 is a schematical perspective view, partially cut away, showing the structure of a propagation path of the dual-conductor type memory.

Before going into a detailed description of the embodiments according to the present invention, a brief explanation of the bubble propagation mechanism will be made with reference to FIG. 1 which schematically shows the propagation path of a minor loop m in the conventional magnetic bubble memory. A closed loop (minor loop m) is constituted in such a manner that a plurality of propagation patterns each formed by a pair of apertures r and s bored in first and second conductors 13 and 15 as illustrated in FIG. 2 are serially arrayed at equal distances to form the propagation path, and a transfer gate G disposed at one corner of the loop so as to perform the input and output of information relative to the loop (transfer operation). As schematically shown in FIG. 2, the first conductor 13 having the aperture r is disposed on a substrate 11 (of garnet, for example) through an insulating spacer 12 and the second conductor 15 having the aperture s is disposed on the first conductor 13 through insulating spacer 14 so as to partly overlap the aperture r in relation to the surface of the substrate 11. In the propagation patterns as illustrated, the hatched aperture r is shown as being provided in the first conductor 13. When the currents $I_1$, $I_2$ are applied as a current pulse sequence $i_1 i_2 i_3 i_4$ to the respective conductors 13 and 15 in the direction perpendicular to bubble propagation, as shown in FIG. 3A, a magnetic bubble in the substrate proceeds sequentially through rest points $1\dot{2}\dot{3}4$, and then, the succeeding pulse $i_1$ advances the bubble to a rest point 1 in the adjacent pattern formed by another pair of apertures. In FIGS. 3A and 3B, pulses $i_1$ and $i_3$ are shown by the solid line and pulses $i_2$ and $i_4$ are shown by the dotted line. More concretely, repetition of the sequence $[i_1 i_2 i_3 i_4]$ permits bubbles to circulate on the loop through the rest points $1\dot{2}\dot{3}4$.

The transfer gate G for transferring bubbles between the major loop and the respective minor loops in the conventional memory includes a relatively small aperture r' in the first conductor, which is nested within an aperture s in the second conductor. When the current pulse sequence is rearranged into $[i_1 i_2 i_1 i_4 i_1 \ldots]$ as shown in FIG. 3B, a bubble at point 4a is propagated through $1_b 2_b 1_b 4_b c_1'$ to achieve the bubble transfer from the minor loop to the major loop. Sequence $[i_1 i_4 i_3 i_2 i_1 i_4]$ returns a bubble at point 1' in the pattern Ma of the major loop to the minor loop m. In such a conventional system, however, a half cycle of the bipolar current has to be phase-inverted as shown in FIG. 3B. Consequently, difficulties are encountered in using normal sine-wave current that is the most preferable transfer path or propagation path driving current. Several memories using sine-wave current as the propagation path or coil driving current are proposed, but none of these can continuously transfer a plurality of bits between the major loop and the respective minor loops, because the minor loops are respectively connected to the adjacent loops by way of a linear transfer path with no extra aperture bit between the transfer gates.

The present invention, on the other hand, makes it possible to provide continuous transfer of bubbles between the major loop and the respective minor loops with the arrangement discussed below.

Figure 5:
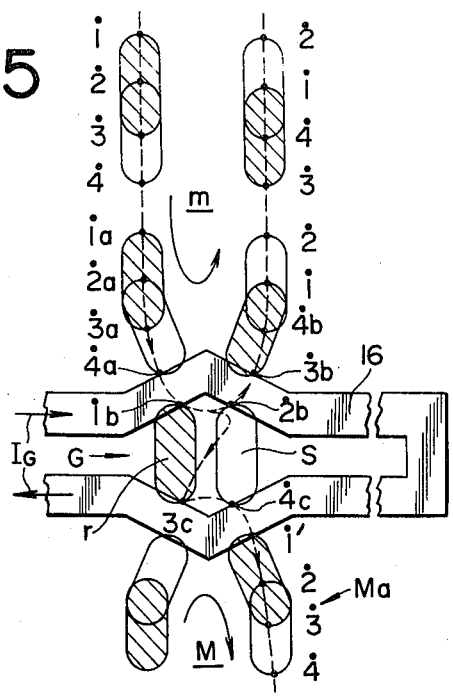
FIG. 5 is an enlarged view of the transfer gate in FIG. 4.
Figure 6A:
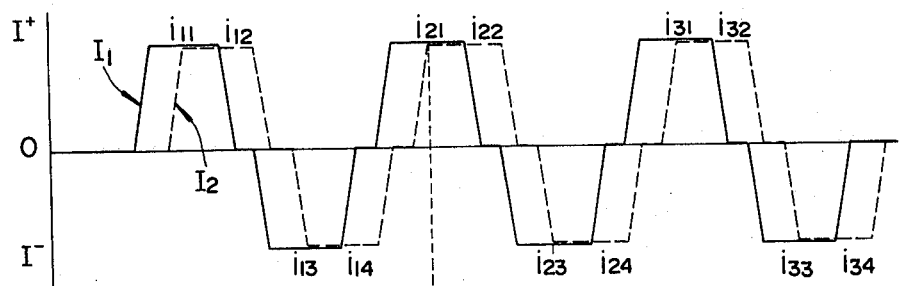
FIGS. 6A and 6B are views illustrative of the current sequence for normal propagation of bubbles and bubble transfer on the gate of FIG. 5.
Figure 8:
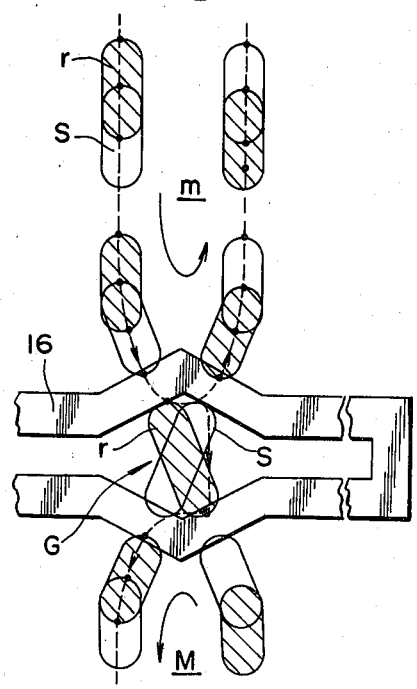

FIG. 4 is a schematic view generally showing the structure of the major-minor loops in a first embodiment of the present invention. One corner of each of minor loops $m_1$, $m_2 \ldots m_m$ is provided with a transfer gate G. A major loop M is connected to the respective transfer gates G by curved line portions $M_1$, $M_2$, ... $M_{m-1}$, which, differently from the linear paths used in the conventional art, run along zigzag course between adjacent minor loops via the transfer gates. The curved line portions $M_1$, $M_2 \ldots M_{m-1}$ carry a plurality of bits (generally 3 or more, preferably 8 or 9). Four bits are shown in the drawing as an example. As shown in FIGS. 5 and 8, the parts of the major and minor loops adjacent to each transfer gate G are symmetrical in their aperture patterns. A gate control conductor 16 is provided across the respective gates between the loops in a to-and-fro manner. One embodiment of the transfer gates is illustrated in FIG. 5, and the respective current sequences in FIG. 6. The bubbles in minor loop m in FIG. 5 are propagated in the order of $1\dot{2}\dot{3}4$ according to the sequence $[i_{11} i_{12} \ldots i_{33} i_{34}]$ of driving currents $I_1$, $I_2$ applied to each of the first and second conductors of FIG. 6A, and propagated in the order of $1_a \dot{2}_a \dot{3}_a 4_a 1_b \dot{2}_b \dot{3}_b \dot{4}_b$ at the corner as shown in FIG. 5. In FIG. 6A, pulses $i_{n1}$ and $i_{n3}$ are shown by the solid line and pulses $i_{n2}$ and $i_{n4}$ are shown by the dotted line. (n = 1,2,3 ... ).

Figure 6B:
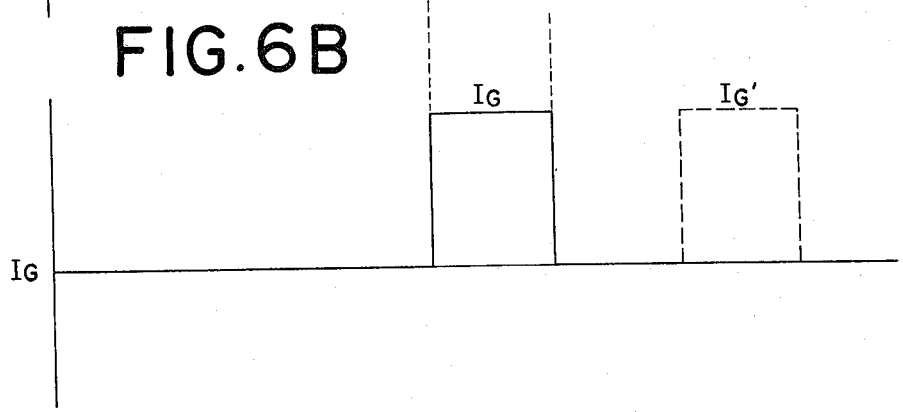

The transfer gate G in the present invention is so constructed that apertures r and s in the first and second conductors are disposed between minor loop m and major loop M, are disposed in parallel relation, and are surrounded by the gate control conductor 16. When gate current $I_G$ is impressed on the control conductor 16 between the leading edge of pulse $i_{n2}$ and the leading edge of pulse $i_{n4}$ of the current sequences $I_1$ and $I_2$ of FIG. 6A, a bubble is transferred to bit pattern Ma of the major loop (n here refers to the cycle number of sine-wave current). Referring to FIGS. 6A and 6B, when gate current $I_G$ is applied to the conductor 16 between the leading edge of pulse $i_{22}$ and the halfway of pulse $i_{23}$ after a bubble is propagated through $1_a \dot{2}_a \dot{3}_a \dot{4}_a \dot{1}_b$ by sequence $[i_{11} i_{12} i_{13} i_{14} i_{21}]$, the bubble moves from 2b to 3c, since the magnetic potential of the region surrounded by the control conductor 16 drops. The bubble is further propagated to $\dot{4}c\dot{1}'$ by subsequent pulses $[i_{24} i_{31} i_{32}]$, whereby bubble transfer from minor loop m to major loop M is completed. The present invention is characterized in that bubbles can continuously be transferred between the minor loop m and the major loop M. Briefly, transfer of succeeding bubbles can be performed by applying gate current $I_G'$ to the control conductor 16 with pulses $i_{32}$, $i_{33}$.

In the conventional memory having a straight major loop, since a bubble transferred to the major loop is located at the gate of the adjacent minor loop when the next transfer operation is completed, the bubble will be distorted due to its interaction caused with the bubble being transferred from the adjacent minor loop to the major loop when a gate current $I_G$ is subsequently applied in order to complete the continuous transfer. According to the process of the present invention, continuous transfer of bubbles is possible without any adverse influence on the transfer performance when a gate current is successively applied between the leading edge of $i_{n2}$ and the leading edge of $i_{n4}$.

The shape and size of the aperture patterns r and s of the gate, the amplitude and timing of the gate current $I_G$ and the width and shape of the control conductor 16 must, of course, be determined in such a manner that complete transfer operation is assured. Moreover, other factors should be carefully considered so as not to disturb normal propagation of the preceeding and succeeding bubbles. For example, it is desirable to use a to-and-fro gate control conductor 16 which is designed to surround apertures r and s and to cover the regions between $4a$-$1b$, $2b$-$3b$ and $4c$-$1$ as illustrated in FIG. 5 to permit application of a gate current to produce a magnetic field with sloped intensity.

Figure 7:
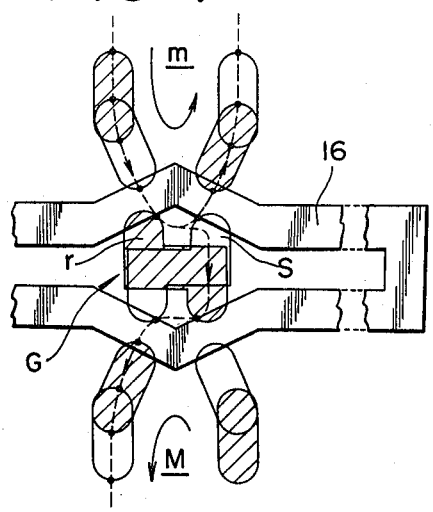
FIGS. 7 and 8 are views showing modifications of the transfer gate.
Figure 9A:
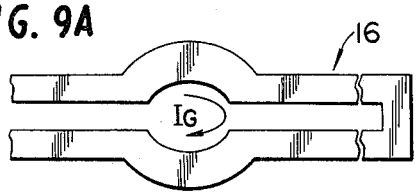
FIGS. 9A to 9I are schematic views showing modified arrangements of the gate control conductor.
Figure 9B:
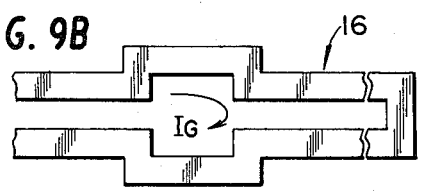
Figure 9C:
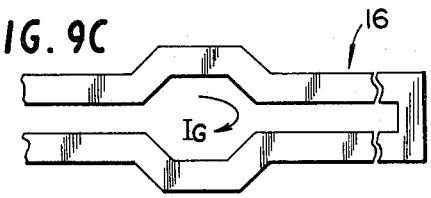
Figure 9D:
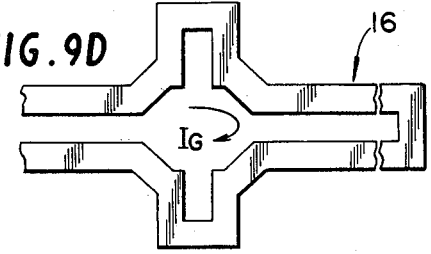
Figure 9E:
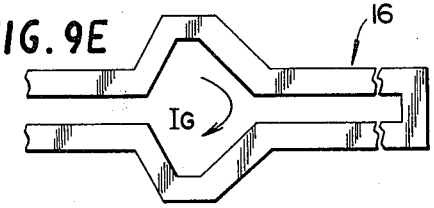
Figure 9F:
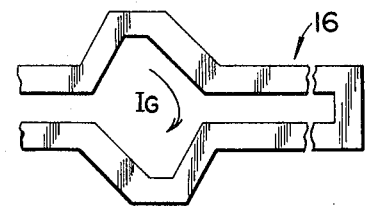
Figure 9G:
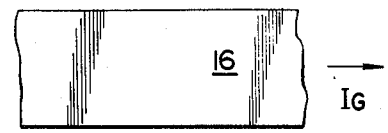
Figure 9H:
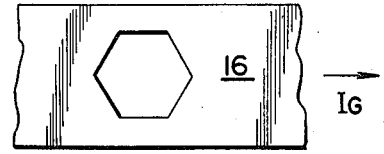
Figure 9I:
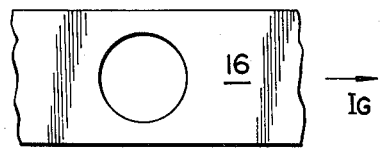

Conversely speaking, the aperture pattern of the gate and the conductor can be diversely modified so that they fulfill the aforesaid requirements. For example, the gate G may be formed by allowing a pair of reversed crank-shaped apertures to be superposed one on the other into an H-shaped as illustrated in FIG. 7, or by superposing a pair of oval apertures into an X-shape as illustrated in FIG. 8. In either case, the propagation locus of the bubbles is as indicated by an arrow. The gate control conductor 16 is only required to include therein the major portions of a pair of corner aperture patterns; in other words, no limitation is imposed upon the shape per se thereof. Consequently, the gate control conductor 16 may be formed into circular shape as shown in FIG. 9A, a rectangular shape as shown in FIG. 9B, a polygonal shape as shown in FIGS. 9C and 9D, an asymmetrical shape as shown in FIGS. 9E and 9F, or some other shape. The gate control conductor 16 need not necessarily take the to-and-fro form, and may be formed of a single line as shown in FIG. 9G or of apertured structures as shown in FIGS. 9H and 9I. The aperture to be bored in the gate conductor is not limited to a specific shape, and may be formed into any one of the aforesaid shapes and other shapes. Though, in the foregoing embodiment, the gate control conductor 16 has been described as being placed on the second conductor 15, the present invention is not restricted to such an embodiment.

The gate control conductor may be disposed on the substrate 11 or the first conductor 13 in view of convenience in the production of chips or other considerations, as occasion demands.

According to another embodiment of the present invention, dummy paths 23 and 24 as shown in FIG. 10 can also be used with greater efficiency. In this drawing, each of the black dots and white dots on the paths shows a pair of aperture patterns of the propagation path, the former being a pattern taking part in the storage or transfer of information, and the latter being a pattern taking no part in such operation.

In the vicinity of the corner C, dummy loops 21 and 22 on both sides of a minor group m' are known in the art and are generally plural in number. These dummy loops are composed of apertured patterns whose arrangements are symmetrical with that of the corresponding minor loops with respect to their major axes, and thus have effects that offset the influence from adjacent patterns to equalize the distributions of magnetic field and current in the storage region. This helps stabilize the distribution of current and magnetic fields in the vicinity of the respective patterns in the linear paths of the respective minor loops. However, an alternative means is required to improve the distribution thereof in the vicinity of the corner of the loops. This is due to the fact that there is no pattern symmetrical with the patterns of the loops at their corners, so that the influence of adjacent patterns is not offset. If patterns are disposed in positions symmetrical with these patterns, then it is possible to equalize the distribution of magnetic fields and current.

For this reason, the dummy transfer paths 23 and 24 come into contact with the respective minor loops and the zigzagging path of the major loop in the vicinity of the transfer gate at their corners C, and are arranged symmetrically with the corresponding loop patterns in the vicinity of the corners C. In a loop m of FIG. 11A which is free from the dummy path, there is a difference in the distribution of magnetic fields between the vicinity of the aperture pattern forming a linear path and that of the corner C. Namely, the aperture pattern located at the linear path, e.g., the pattern indicated by $Q_6$ takes the same form in patterns $Q_5$, $Q_7$ and $Q_4$ symmetrical around its lateral axis l as viewed in the direction of the longitudinal axis L. Consequently, the influence of adjacent patterns arranged in the same linear path is offset. Furthermore, the patterns of adjacent propagation paths are placed in positions that are the points symmetrical substantially with respect to $Q_6$. Therefore, the influence from these patterns is also offset. As a result, the distribution of magnetic fields in the L-direction is a periodic function of space assuming an identical value zero on the lateral axis of each pattern. Since no aperture pattern symmetrical with the patterns $Q_3$ and $Q_4$ is disposed in relation to the corner pattern $Q_0$, the influence from adjacent patterns is not offset, thus rendering the magnetic fields in the vicinity of $Q_0$ positive or negative depending upon the direction of current. The operating margin which may be represented even by a region within which bubbles are propagated in the topological product defined by the driving magnetic field and the driving current is decreased by the inclination of the field thus caused as compared with that in the vicinity of $Q_6$. The margin throughout the loops is determined by pattern, so that loop design is subject to severe restrictions. Therefore, aperture patterns $Q_3^-$ and $Q_4^-$ constituting the dummy path 24 are respectively located symmetrically with the patterns $Q_3$ and $Q_4$ in relation of the pattern $Q_0$ at the corner of the loop m, whereby the aforesaid disadvantage can be eliminated. Similarly to the dummy path 24, the function of the dummy path 23 will be understood.

As described above, according to the present invention, the degree of freedom in waveform of the driving current to be used for bubble transfer and propagation can be increased and numerous information bits stored in each of the adjacent minor loops can be continuously transferred in and out of the minor loop.

Further, the availability factor of the major loop can be improved by making the return path 25 of the major loop straight as illustrated in FIG. 10, thereby increasing the amount of informations stored in the minor loops per propagation step to efficiently read them out of the minor loops.

One of information bits serially transferred out of each minor loop can be used as a parity bit so that a parity check can be carried out for each minor loop. This parity check offers significant advantages particularly under the circumstances that the loops have different driving margins, because of irregularities in the shape and size of the aperture patterns when the bubbles to be propagated become smaller in diameter.

What is claimed is:

1. A dual-conductor type current-access magnetic bubble memory having first and second conductors, which comprises:

a major loop constituted by a linear propagation path, formed by a serial train of paired apertures bored in the first and second conductors and zigzag propagation path formed of a serial train of paried apertures bored in the first and second conductors, a plurality of minor loops each constituted by a serial train of paired apertures bored in said first and second conductors, a plurality of transfer gates each defined by a pair of apertures and arranged so as to connect the respective minor loops with the major loop on the zigzag propagation path thereof, and a gate control conductor capable of imparting a magnetic field to the transfer gates consisting of paired apertures, said zigzag propagation path being provided with at least three aperture patterns for propagating bubbles between the adjacent transfer gates, whereby a series of bubbles can be transferred between the major loop and the respective minor loops by applying gate current pulses to said gate control conductor while a current pulse sequence is applied to each of said first and second conductors.

2. A magnetic bubble memory as set forth in claim 1, wherein said transfer gates are formed by juxtaposing a pair of apertures in parallel.

3. A magnetic bubble memory as set forth in claim 1, wherein said transfer gates are formed by superposing a pair of reversed crank-shaped apertures upon each other to form an H-shape.

4. A magnetic bubble memory as set forth in claim 1, wherein said transfer gates are formed by superposing a pair of oval apertures upon each other to form an X-shape.

5. A magnetic bubble memory as set forth in claim 1, wherein:
said gate control conductor is a to-and-fro line conductor arranged so as to surround the respective transfer gates and drives the transfer gate with a non-varying sequence of driving currents to transfer bubbles between the major and minor loops.

6. A magnetic bubble memory as set forth in claim 1, wherein:
said gate control conductor is a single line conductor having an aperture at each said transfer gate and drives the transfer gate with a non-varying sequence of driving currents to transfer bubbles between the major and minor loops.

7. A magnetic bubble memory as set forth in claim 1, further comprising dummy propagation paths connected to said major and minor loops at their corners opposite to said transfer gates.

8. A magnetic bubble memory, according to claim 1, wherein:
each of said minor loops including a parity bit, such that a parity check is conducted by said major loop.

* * * * *